(12) United States Patent
Nishimura (10) Patent No.: US 7,777,205 B2
(45) Date of Patent: Aug. 17, 2010

(54) ELECTRON BEAM LITHOGRAPHY SYSTEM

(75) Inventor: Rieko Nishimura, Yokohama (JP)

(73) Assignee: NuFlare Technology, Inc., Numazu-shi (JP)

( * ) Notice: Subject to any disclaimer, the term of this patent is extended or adjusted under 35 U.S.C. 154(b) by 10 days.

(21) Appl. No.: 12/055,669

(22) Filed: Mar. 26, 2008

(65) Prior Publication Data

US 2008/0237493 A1 Oct. 2, 2008

(30) Foreign Application Priority Data

Mar. 28, 2007 (JP) .............................. 2007-083464

(51) Int. Cl.
*H01J 49/00* (2006.01)
*H01J 49/44* (2006.01)

(52) U.S. Cl. .............................. 250/492.22; 250/492.1; 250/492.3; 250/491.1; 250/398; 355/52; 355/53; 356/399

(58) Field of Classification Search .............. 250/492.1, 250/492.22, 492.3

See application file for complete search history.

(56) References Cited

U.S. PATENT DOCUMENTS 6,262,429 B1 * 7/2001 Rishton et al. ......... 250/492.23

FOREIGN PATENT DOCUMENTS

JP 2005-129850 5/2005

OTHER PUBLICATIONS

Wang Zhigang, et al., "Recent CD accuracy improvements for HL-7000M", Proceedings of SPIE, vol. 5446, pp. 657-668.

* cited by examiner

*Primary Examiner*—David A Vanore
(74) *Attorney, Agent, or Firm*—Oblon, Spivak, McClelland, Maier & Neustadt, L.L.P.

(57) ABSTRACT

An electron beam lithography method is provided for sequentially irradiating an electron beam deflected by a deflector on a shot-by-shot basis to draw a pattern on a surface of a sample mounted on a stage. This method includes the step of irradiating the electron beam on the sample surface as a combination of shots each irradiated in one of rectangular or square regions having the same area and different shapes, in order to draw a correction pattern. This method also includes the steps of correcting the shape of the electron beam based on the drawn correction pattern, and drawing a pattern using the shape-corrected electron beam.

6 Claims, 8 Drawing Sheets

ELECTRON BEAM LITHOGRAPHY SYSTEM

CROSS REFERENCE TO RELATED APPLICATIONS

This application is based on and claims the benefit of priority from prior Japanese Patent Application No. 2007-83464, filed on Mar. 28, 2007, the entire contents of which are incorporated herein by reference.

BACKGROUND OF THE INVENTION

1. Field of the Invention

The present invention relates to a system and a method for electron beam lithography, and more particularly, to a system and a method for electron beam lithography having an improved patterning accuracy.

2. Description of the Related Art

An electron beam lithography system is used to form a semiconductor integrated circuit pattern on a resist applied on a mask or a semiconductor wafer. The electron beam lithography system irradiates an electron beam to a predetermined region in the mask or the semiconductor wafer by deflecting and scanning the beam by an electromagnetic means.

The electron beam lithography system draws a predetermined pattern on a resist applied on the mask or the like as follows. The mask or the like is mounted on an X-Y stage and an electron beam is irradiated in a predetermined region on a shot-by-shot basis while the X-Y stage is moved. The electron beam lithography system requires a high accuracy. When, therefore, the electron beam is irradiated in shot regions of different shapes, the shot shapes are corrected from the resulting patterns for more accurate irradiation. This technique is disclosed, for example, in WANG Zhigang et al., "Recent CD accuracy improvements for HL-7000M," Proceedings of SPIE, VOL. 5446, pp 657-668, 2004.

SUMMARY OF THE INVENTION

An aspect of the present invention is an electron beam lithography system for sequentially irradiating an electron beam deflected by a deflector on a shot-by-shot basis to draw a pattern on a surface of a sample mounted on a stage, the electron beam being irradiated on the sample surface as a combination of shots irradiated in rectangular or square regions of different shapes, and the rectangular or square regions having the same area among a plurality of shots.

Another aspect of the present invention is an electron beam lithography system for sequentially irradiating an electron beam deflected by deflectors of a plurality of stages on a shot-by-shot basis to draw a pattern on a surface of a sample mounted on a stage, regions of a pattern to be drawn being divided into frames to which the electron beam is deflectable by a main deflection, the main deflection positions the electron beam to any sub-field position within each of the frame, and an sub-deflection draws a pattern in a sub-field, the electron beam being irradiated on the sample surface as a combination of shots irradiated in rectangular or square regions of different shapes, and the rectangular or square regions having the same area over a plurality of shots.

Another aspect of the present invention is an electron beam lithography method for sequentially irradiating an electron beam deflected by a deflector on a shot-by-shot basis to draw a pattern on a surface of a sample mounted on a stage, the method comprising the steps of: irradiating the electron beam on the sample surface as a combination of shots each irradiated in one of rectangular or square regions having the same area and different shapes in order to draw a correction pattern; correcting the shape of the electron beam based on the drawn correction pattern; and drawing a pattern using the shape-corrected electron beam.

Another aspect of the present invention is an electron beam lithography system for sequentially irradiating an electron beam deflected by deflectors of a plurality of stages on a shot-by-shot basis to draw a pattern on a surface of a sample mounted on a stage, regions of a pattern to be drawn being divided into frames to which the electron beam is deflectable by a main deflection, the main deflection positions the electron beam to any sub-field position within each of the frame, and an sub-deflection draws a pattern in a sub-field, the method comprising the steps of: irradiating the electron beam on the sample surface as a combination of shots each irradiated in one of rectangular or square regions having the same area and different shapes in order to draw a correction pattern; correcting the shape of the electron beam based on the drawn correction pattern; and drawing a pattern using the shape-corrected electron beam.

Another aspect of the present invention is an electron beam lithography method, wherein the shape of the electron beam is corrected by adjusting a voltage applied to the deflector to change the shape of the electron beam.

DETAILED DESCRIPTION OF THE EMBODIMENTS

[Electron Beam Lithography System]

An embodiment of the present invention will be described below.

Figure 1:
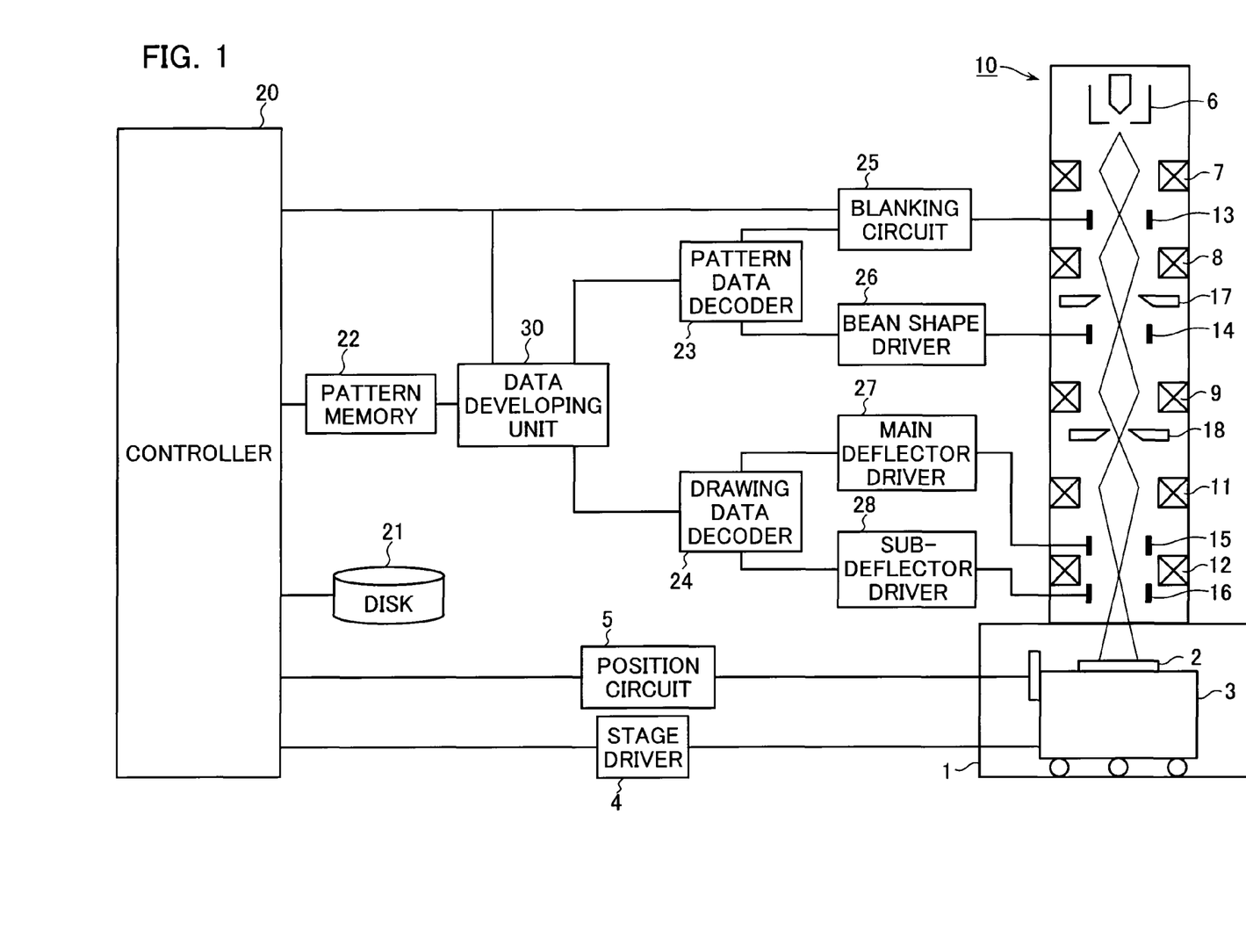
FIG. 1 is a configuration diagram of an electron beam lithography system according to an embodiment of the present invention.

FIG. 1 is a configuration diagram of an electron beam lithography system according to a first embodiment of the present invention. The electron beam lithography system includes a sample chamber 1. The chamber 1 contains a stage 3. The stage 3 bears a sample 2 such as a mask to be electron-beam patterned. The stage 3 is driven by a stage driver circuit 4 in the X-direction (the horizontal direction in the plane of FIG. 1) and the Y-direction (the depth direction in the plane of FIG. 1). The position of the stage 3 is measured by a position circuit 5 including a laser distance meter or the like.

An electron beam optical system 10 resides above the sample chamber 1. The optical system 10 includes an electron gun 6, various lenses 7, 8, 9, and 11, a focus lens 12, a blanking deflector 13, a beam-dimension adjusting deflector 14, a beam-scanning main deflector 15, a beam-scanning sub-deflector (auxiliary deflector) 16, and two beam-shaping apertures 17 and 18.

Figure 2:
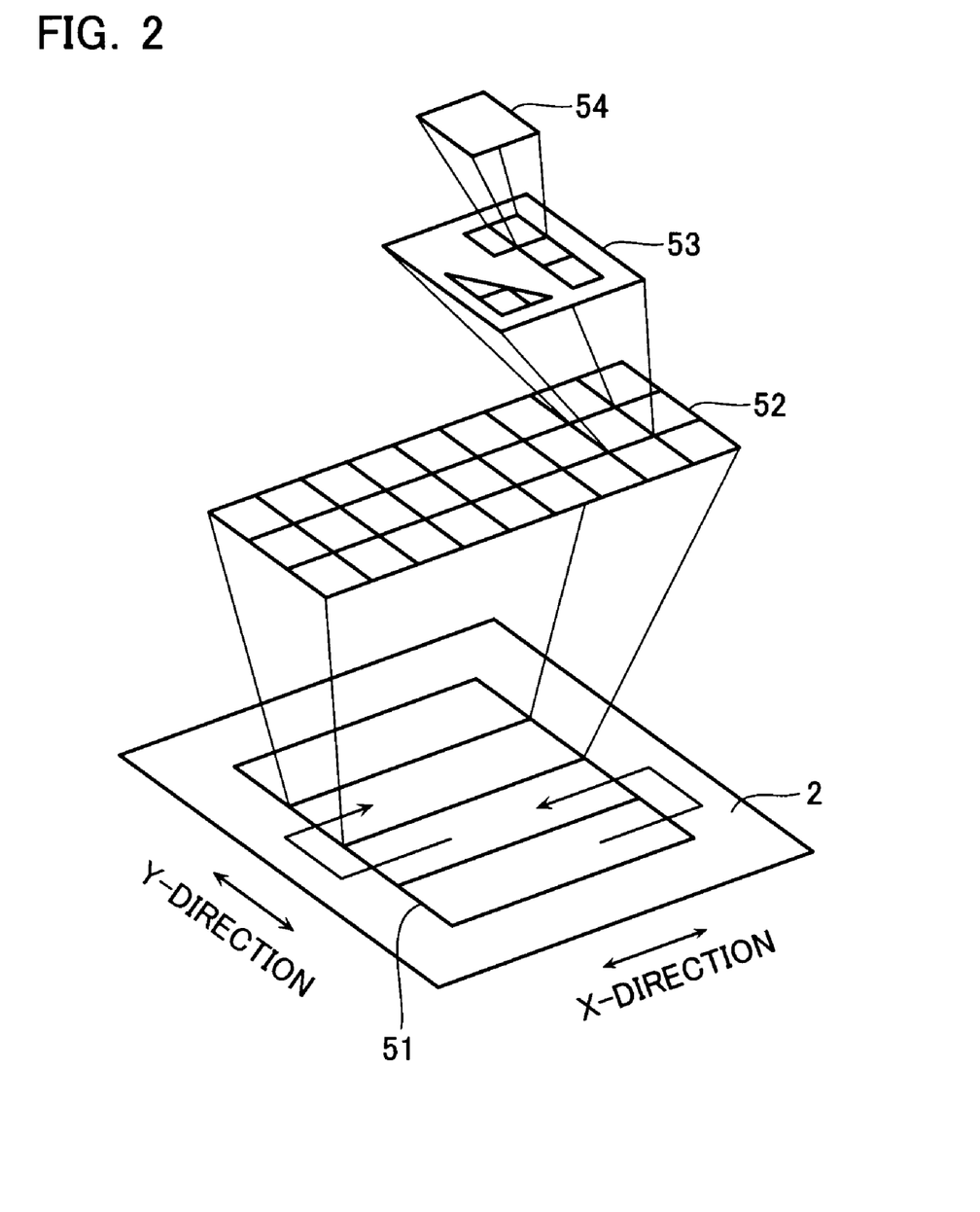
FIG. 2 is a schematic diagram of an electron beam lithography method according to an embodiment of the present invention.

Referring to FIG. 2, the system typically draws a pattern on the sample 2 using the electron beam as follows. A pattern 51 to be drawn on the sample 2 is divided into strip-like frame regions 52. Each frame region 52 is patterned while the stage 3 is continuously moved in the X-direction. The frame region 52 is additionally divided into sub-field regions 53. Only the necessary portion within the sub-field region 53 is patterned by shots 54 of deflected variable shaped beams such as electron beams. The optical system 10 includes two deflectors: the main deflector 15 and the sub-deflector 16. The main deflector 15 positions the electron beam to the sub-field region 53 within the frame region 52. The sub-deflector 16 draws a pattern in the sub-field region 53 using the electron beam.

The electron beam lithography system may draw a pattern on the sample as follows. The main deflector 15 positions the electron beam to a predetermined one of the sub-field regions 53. The sub-deflector 16 determines a pattern-drawing position within the predetermined sub-field region 53. The beam-dimension adjusting deflector 14 and the beam-shaping apertures 17 and 18 control the beam shape. The sub-field region 53 is patterned while the stage 3 is continuously moved in one direction. After one sub-field region 53 is thus patterned, the next sub-field region 53 is patterned. The frame region 52 is a strip-like drawing region defined by the deflection width of the main deflector 15. The sub-field region 53 is a unit drawing region defined by the deflection width of the sub-deflector 16.

After the frame region 52 including a plurality of sub-field regions 53 is patterned, the stage 3 is moved stepwise as necessary in a direction perpendicular to the direction in which the stage 3 is continuously moved. The next frame region 52 is then patterned.

The controller 20 has a storage medium such as a magnetic disk 21 connected thereto. The magnetic disk 21 stores drawing data of a mask. After read from the magnetic disk 21, the drawing data is temporarily stored in the pattern memory 22 for each frame region 52. The pattern data for each frame region 52 stored in the pattern memory 22, such as the drawing position and drawing data, forms a part of frame information. The frame information is sent via a data developing unit 30 to a data analysis portion such as a pattern data decoder 23 and a drawing data decoder 24.

The data developing unit 30 has a function of selecting and extracting, from data stored in the pattern memory 22, data included in the frame region set by the controller 20.

Output from the pattern data decoder 23 is connected to a blanking circuit 25 and a beam shape driver 26. Specifically, the pattern data decoder 23 uses the above data from the data developing unit 30 to create blanking data. The blanking data is sent to the blanking circuit 25. The pattern data decoder 23 also creates desired beam-dimension data. The beam-dimension data is sent to the beam shape driver 26. The beam shape driver 26 sends a predetermined deflection signal to the beam-dimension adjusting deflector 14 in the electron optical system 10. The deflection signal controls a dimension of the electron beam.

The drawing data decoder 24 sends output to the main deflector driver 27 and the sub-deflector driver 28. The main deflector driver 27 sends a predetermined deflection signal to the main deflector 15 in the electron optical system 10. The deflection signal deflects the electron beam to a predetermined main deflection position. The sub-deflector driver 28 sends a predetermined sub-deflection (auxiliary deflection) signal to the sub-deflector 16. The auxiliary deflection signal causes the electron beam to draw a pattern within the sub-field region 53.

[Correction Method]

Correction in the electron beam lithography system will be described in more detail below.

Figure 3A:
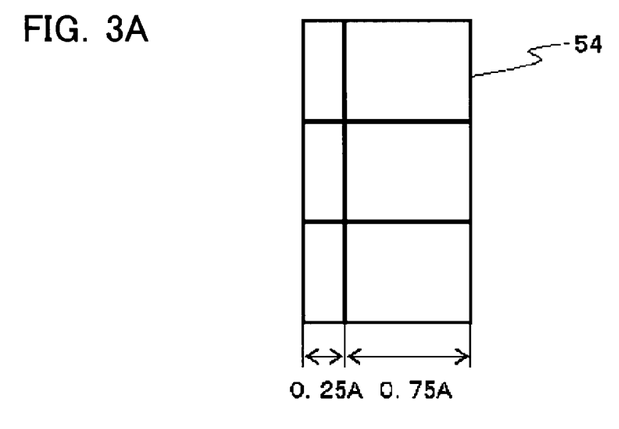
FIGS. 3A to 3C are each a configuration diagram of a drawing pattern for correction.
Figure 3B:
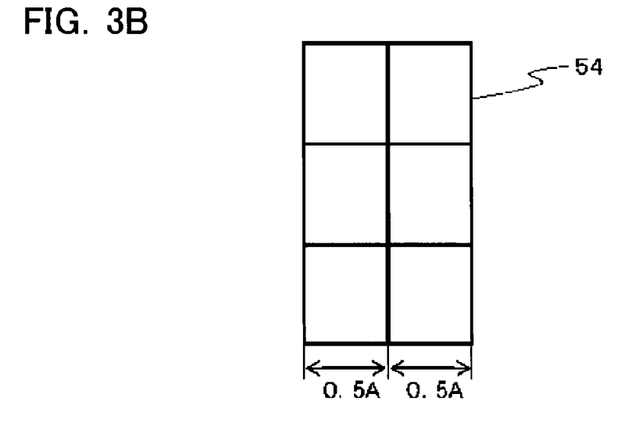
Figure 3C:
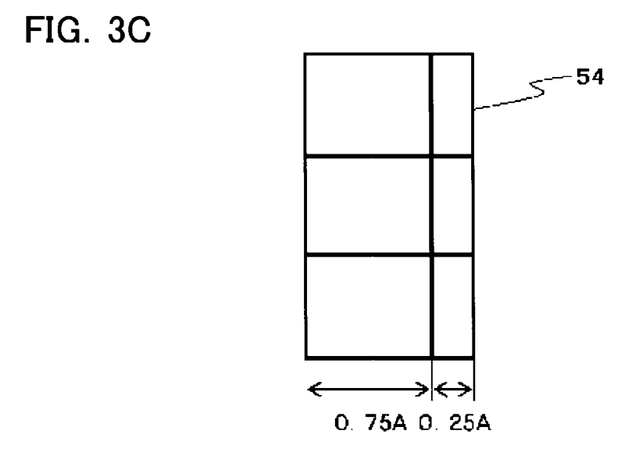

FIGS. 3A to 3C illustrate how to correct the shots 54 of different shapes in a general electron beam system. Specifically, when the same rectangular pattern is drawn, the beam-shaping apertures 17 and 18 in FIG. 1 change the shapes of the shots 54 for correction.

Assume, for example, that the electron beam is irradiated with three different shot widths as described in the following (1) to (3) to draw the same rectangular pattern.

(1) With reference to FIG. 3A, the pattern is drawn using combined shots of a shot width of 0.25 and a shot width of 0.75 from the left.

(2) With reference to FIG. 3B, the pattern is drawn using combined two shots of a shot width of 0.5.

(3) With reference to FIG. 3C, the pattern is drawn using combined shots of a shot width of 0.75 and a shot width of 0.25 from the left.

In these three cases of (1) to (3), the critical dimension (CD) variation is measured for each drawn pattern. This determines the dependence of the CD variation on the shot size. The dependence is used in the correction.

The shots 54 used in the variation measurement are different in size. The different shot sizes provide different focal distances due to the coulomb effect.

Figure 4:
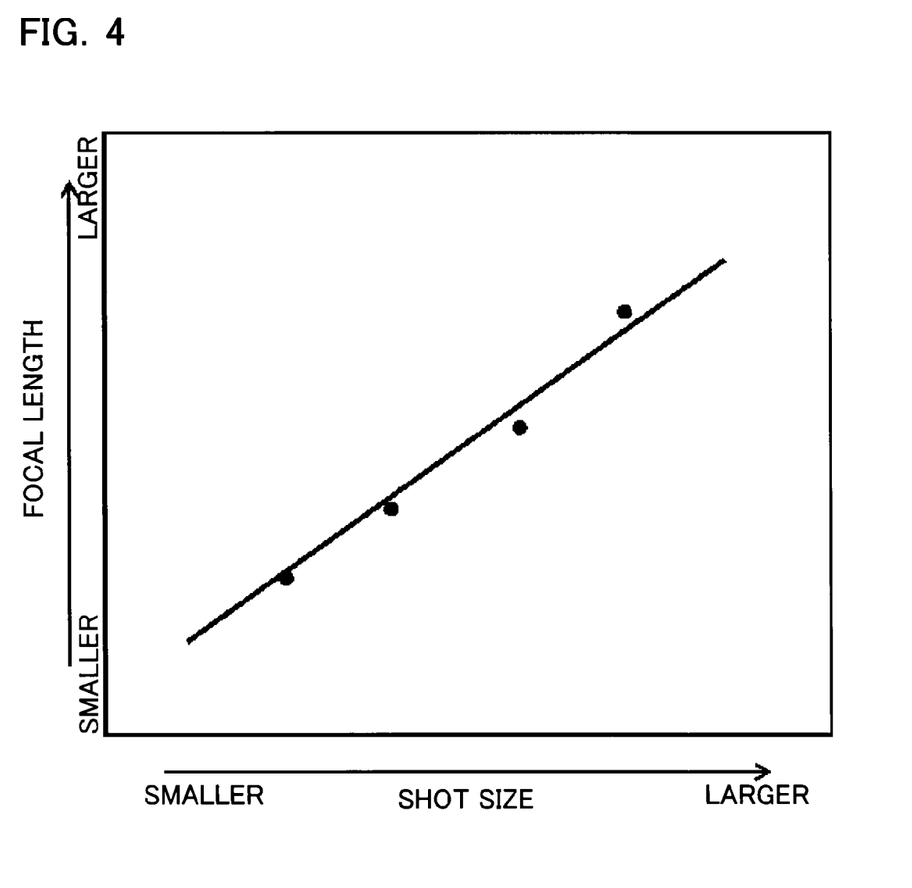
FIG. 4 shows a profile of shot size versus focus lens's focal distance.

More specifically, with reference to FIG. 4, the electron beam is focused by the focus lens 12 of the final stage, and even when the same focus lens 12 is used, a larger shot size will cause a larger focal distance. This is a phenomenon due to the fact that the electron beam consists of charged particles, causing electron-electron interactions. The phenomenon does not occur in an electromagnetic wave such as light that has no such interactions.

Figure 5A:
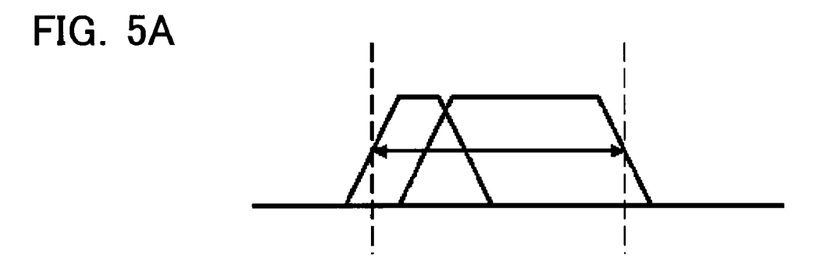
FIGS. 5A to 5C each show dose distribution when the patterns in FIGS. 3A to 3C are irradiated.
Figure 5B:
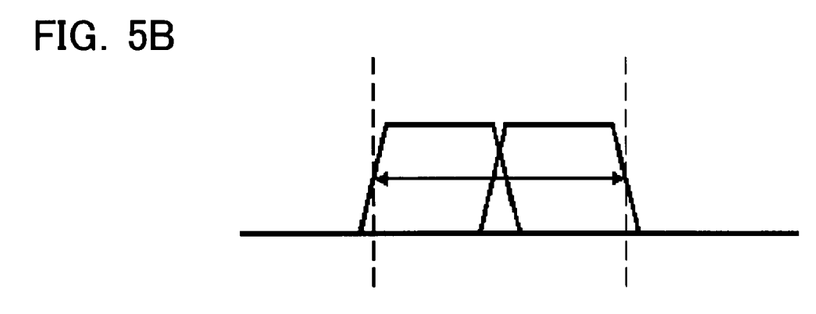
Figure 5C:
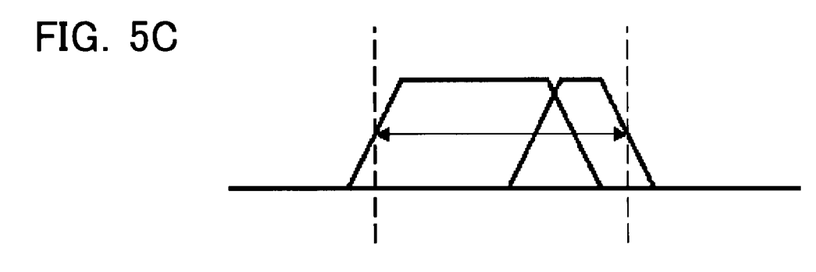
Figure 6A:
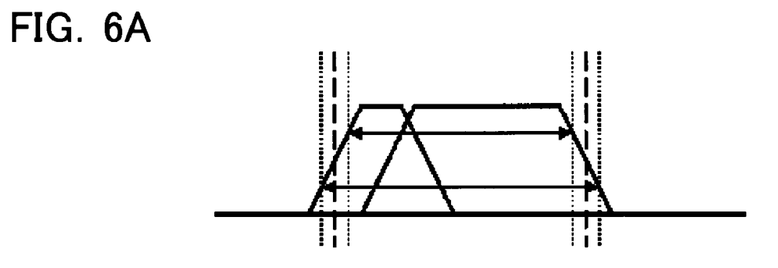
FIGS. 6A to 6C each show dose distribution when the patterns in FIGS. 3A to 3C are irradiated.
Figure 6B:
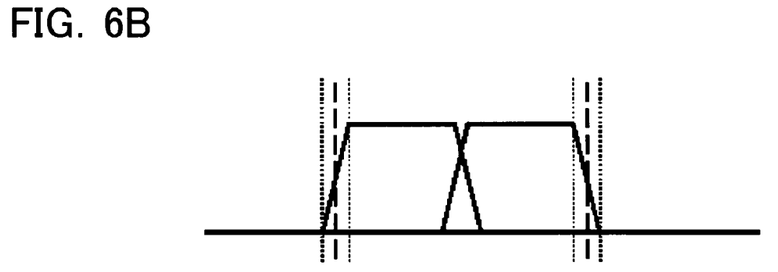
Figure 6C:
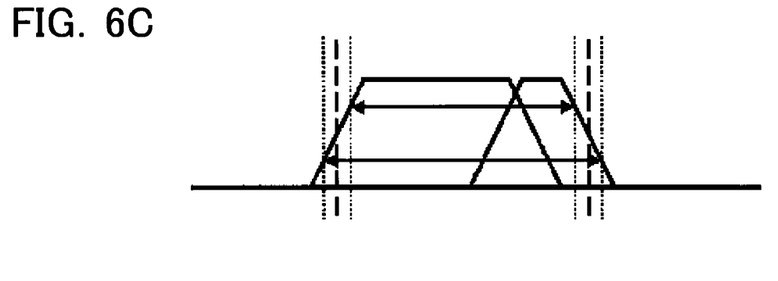

With the focus lens 12 in a constant condition, therefore, the patterns in FIGS. 3A to C drawn will give dose distributions in FIGS. 5A to C, respectively. Specifically, when the electron-beam shots 54 in FIG. 3B are used to draw a pattern with the focus lens 12 suitably conditioned, the dose varies steeply in the edge portion of the drawing pattern as shown in FIG. 5B. When the electron-beam shots 54 in FIGS. 3A and 3C are used to draw a pattern in the same condition, the dose varies slowly in the edge portion of the drawing pattern as shown in FIGS. 5A and 5C. With reference to the dotted lines in FIG. 5A, when the drawn pattern is developed or the like in a suitable process, a pattern is formed with a width shown by the arrows. When the dose or process varies, however, different patterns are formed depending on the sizes of the electron-beam shots 54 as shown in FIGS. 6A to 6C. Specifically, in FIG. 6B, the dose varies steeply in the edge portion, so dose variation or process variation affects less on the pattern shape, causing less variation in the shape. In FIGS. 6A and C, the dose varies slowly in the edge portion, so the dose variation or process variation affects much more on the pattern shape, causing a larger variation in the shape.

This occurs because the focus lens changes the focal position depending on the shot size, as is evident in FIG. 4. If, therefore, each shot has the same shot size, the focus lens 12 will decrease the change in the focal position, reducing the above issue. The applicant has empirically found that the electron beam irradiated in the shot region 54 of a constant area will provide a constant shot size.

The present invention is based on the above knowledge. Specifically, with reference to FIGS. 7A to 7C, the electron beam is irradiated in a region of the same area in each shot, allowing for a constant dose variation in the edge portion of the formed pattern.

Irradiation of the electron-beam shot of the same shot size may reduce the focus variation on the sample surface. The formation parameter may thus be computed according to the stable and accurate shot size. The correction based on the formation parameter thus computed may provide the accurate electron-beam patterning.

Figure 7A:
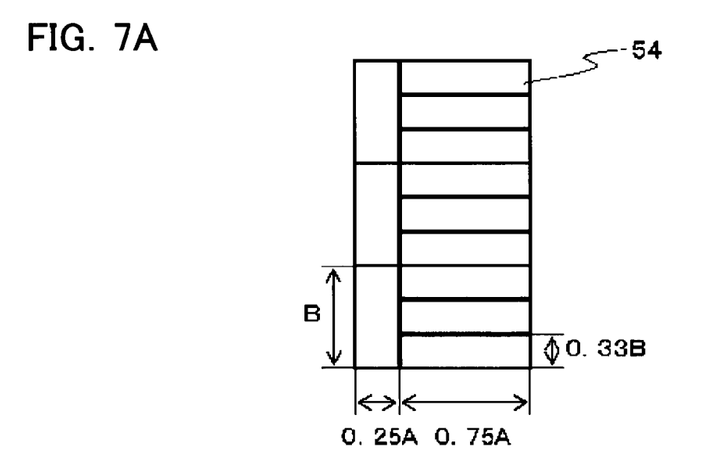
FIGS. 7A to 7C are each a configuration diagram of a drawing pattern for correction according to an embodiment of the present invention.
Figure 7B:
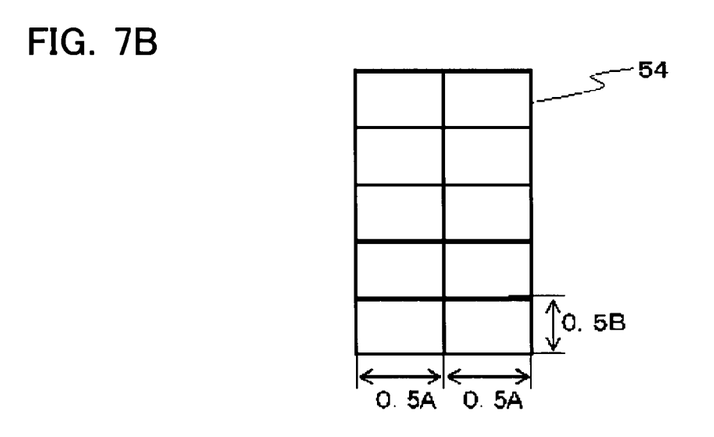
Figure 7C:
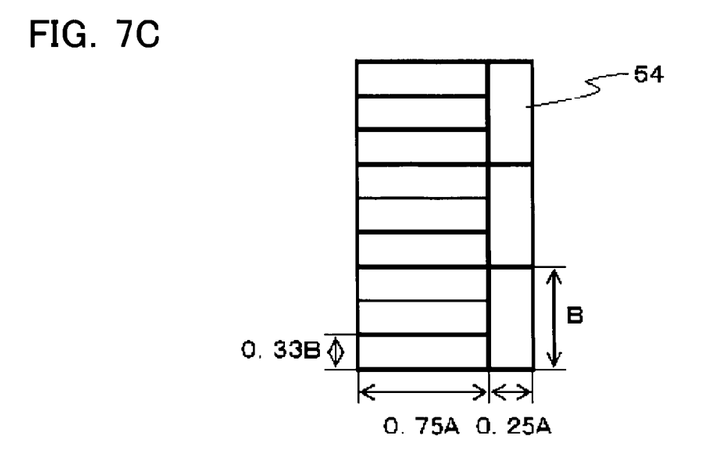
Figure 8:
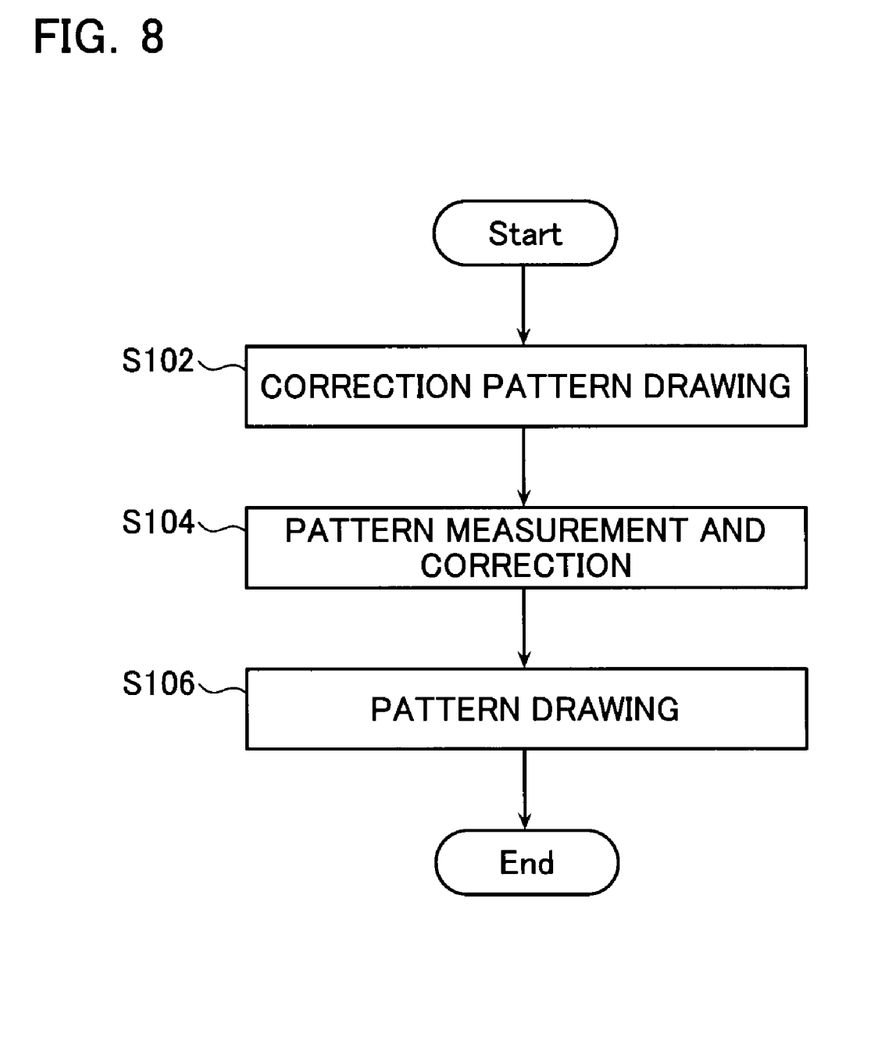
FIG. 8 shows a flowchart of an electron beam lithography method according to an embodiment of the present invention.

With reference to FIG. 8, the patterning correction in this embodiment will be described below. First, at step 102 (S102), a pattern is drawn using the shots shown in FIGS. 7A to 7C. Specifically, each electron-beam shot that is irradiated stepwise is set to have the same area.

Specifically, a pattern is drawn as follows.

(4) with reference to FIG. 7A, a pattern is drawn using a combination of a shot having a vertical length of 1 and a lateral length of 0.25 and a shot having a vertical length of 0.33 and a lateral length of 0.75.

(5) with reference to FIG. 7B, a pattern is drawn using a combination of two shots each having a vertical length of 0.5 and a lateral length of 0.5.

(6) with reference to FIG. 7C, a pattern is drawn using a combination of a shot having a vertical length of 0.33 and a lateral length of 0.75 and a shot having a vertical length of 1 and a lateral length of 0.25.

Then at step 104 (S104), the patterns drawn at step 102 are developed and then measured to correct the electron-beam shape. Specifically, the beam shape driver 26 adjusts the voltage applied to the beam-dimension adjusting deflector 14 to correct the electron-beam shape. Note that the electron-beam shape may also be corrected by varying the shapes of the beam-shaping apertures 17 and 18.

Then at step 106 (S106), the shape-corrected electron beam is used to draw the actual pattern. The electron-beam pattern drawing is thus ended.

[Patterning Method]

With reference to FIGS. 1 and 2, a patterning procedure of the electron beam lithography system in this embodiment will be specifically described below.

First, the sample 2 is disposed on the stage 3 in the sample chamber 1. The position of the stage 3 is then detected by the position circuit 5. Then, according to the signal from the controller 20, the stage driver 4 moves the stage 3 to a position that allows the sample 2 to be patterned.

The electron gun 6 then emits the electron beam. The electron beam is collected by a condenser lens 7. The blanking deflector 13 may transmit or not transmit the electron beam to the sample 2.

The electron beam then enters the beam-shaping aperture 17. The beam passes through the opening of the beam-shaping aperture 17. The beam is then deflected by the beam-dimension adjusting deflector 14, which is controlled by the beam shape driver 26. The beam then passes through the opening of the beam-shaping aperture 18. The electron beam is thus finally shaped to a desired beam shape such as a spot pattern. The spot pattern is a drawing unit of the electron beam irradiated to the sample 2. A plurality of spot patterns form one drawing pattern.

After the electron beam is shaped to the spot pattern, it is reduced by the reduction lens 11. A pattern is drawn on the sample 2 by irradiating the electron beam to the sample 2. The irradiation position on the sample 2 is controlled by the main deflector 15 and the sub-deflector 16. The main deflector driver 27 controls the main deflector 15. The sub-deflector driver 28 controls the sub-deflector 16. The main deflector driver 15 deflects the electron beam to a predetermined region on the sample 2 where the beam is then deflected by the sub-deflector. In other words, the main driver 15 positions the frame region 52. The sub-deflector driver 16 positions the pattern drawing position in the sub-field drawing region 53.

A pattern is drawn on the sample 2 by the electron beam as follows. The sample 2 is scanned by the electron beam while the stage 3 is moved in one direction, thereby drawing a pattern in the sub-field region 53.

A description is given of how the controller 20 controls the patterning. The controller 20 reads the drawing data of the mask recorded in storage media such as the magnetic disk 21. The controller 20 then temporarily stores the drawing data in the pattern memory 22 for each frame region 52.

The drawing data is formed for each frame region 52 and is stored in the pattern memory 22. The drawing data is then sent via the data analysis portion, the portion including the pattern data decoder 23 and the drawing data decoder 24, to the blanking circuit 25, the beam shape driver 26, the main deflector driver 27, and the sub-deflector driver 28.

The pattern data decoder 23 creates the blanking data according to the drawing data from the data developing unit 30. The decoder 23 then sends the blanking data to the blanking circuit 25. The decoder 23 also creates, according to the drawing data, the desired beam-shape data. The decoder 23 then sends the beam-shape data to the beam shape driver 26.

The beam shape driver 26 applies a predetermined deflection signal to the beam-dimension adjusting deflector 14 in the optical system 10. The deflection signal controls the dimension of the electron beam.

The drawing data decoder 24 creates, according to the drawing data, sub-field determination data. The decoder 24 then sends the sub-field determination data to the main deflector driver 27. The main deflector driver 27 then applies a predetermined deflection signal to the main deflector 15. The deflection signal deflects and scans the electron beam to a predetermined sub-field position.

The drawing data decoder 24 generates, according to the drawing data, a control signal of scanning of the sub-deflector 16. The decoder 24 then sends the control signal to the sub-deflector driver 28. The sub-deflector driver 28 applies a predetermined auxiliary deflection signal to the sub-deflector 16. A pattern is thus drawn in the sub-field region 53.

In this way, in this embodiment, the electron-beam shots of the same area and different shapes are irradiated and the shapes are corrected, improving the patterning accuracy of the electron beam lithography system.

Thus, a system and a method for electron beam lithography according to preferred embodiments of the present invention have been described in detail, but the present invention is not limited to the disclosed embodiments, and other embodiments may also be applied.

What is claimed is:

1. An electron beam lithography system for sequentially irradiating an electron beam deflected by a deflector on a shot-by-shot basis to draw a pattern on a surface of a sample mounted on a stage, the system comprising:
 a deflector for deflecting the electron beam;
 a beam dimension-adjusting deflector for controlling a dimension of the electron beam;
 a beam-shaping aperture for changing a shape of the electron beam;
 a driver configured to drive the deflector and the beam dimension-adjusting deflector to control a shape and a dimension of the electron beam; and a controller for controlling the driver based on drawing data, wherein the controller being configured to control, via the driver, the deflector and the beam dimension-adjusting deflector to generate a plurality of shots having the same dimensions and different shapes on the surface of the sample, irradiates the electron beam as the plurality of shots onto one rectangular or square region to draw a correction pattern, and then adjusting the shape of the electron beam to draw a pattern with a shape-adjusted electron beam based on the correction pattern.

2. An electron beam lithography system for sequentially irradiating an electron beam deflected by deflectors of a plurality of stages on a shot-by-shot basis to draw a pattern on a surface of a sample mounted on a stage, regions of a pattern to be drawn being divided into frames to which the electron beam is deflectable by a main deflection, the main deflection positions the electron beam to any sub-field position within each of the frame, and an sub-deflection draws a pattern in a sub-field, the system comprising:

a main deflector for deflecting the electron beam onto any sub-field position, an auxiliary deflector for deflecting the electron beam within one of the sub-field position, a beam dimension-adjusting deflector for controlling a dimension of the electron beam;

a beam-shaping aperture for changing a shape of the electron beam;

a driver configured to drive the main deflector, the auxiliary deflector and the beam dimension-adjusting deflector to control a shape and a dimension of the electron beam; and a controller for controlling the driver based on drawing data wherein the controller being configured to control, via the driver, the main deflector, the auxiliary deflector and the beam dimension-adjusting deflector to generate a plurality of shots having the same dimensions and different shapes on the surface of the sample, irradiates the electron beam as the plurality of shots onto one rectangular or square region to draw a correction pattern, and then adjusting the shape of the electron beam to draw a pattern with a shape-adjusted electron beam based on the correction pattern.

3. An electron beam lithography method for sequentially irradiating an electron beam deflected by a deflector on a shot-by-shot basis to draw a pattern on a surface of a sample mounted on a stage, the method comprising the steps of:

irradiating the electron beam as a plurality of shots onto one rectangular or square region on the surface of the sample to draw a correction pattern, the plurality of shots having the same dimensions and different shapes;

adjusting a shape of the electron beam based on the correction pattern; and drawing a pattern using the shape-corrected electron beam.

4. The electron beam lithography method according to claim 3, wherein the shape of the electron beam is corrected by adjusting a voltage applied to the deflector to change the shape of the electron beam.

5. An electron beam lithography method system for sequentially irradiating an electron beam deflected by deflectors of a plurality of stages on a shot-by-shot basis to draw a pattern on a surface of a sample mounted on a stage, regions of a pattern to be drawn being divided into frames to which the electron beam is deflectable by a main deflection, the main deflection positions the electron beam to any sub-field position within each of the frame, and a sub-deflection draws a pattern in a sub-field, the method comprising the steps of:

irradiating the electron beam as a plurality of shots onto one rectangular or square region on the surface of the sample to draw a correction pattern, the plurality of shots having the same dimensions and different shapes;

adjusting a shape of the electron beam based on the drawn correction pattern; and drawing a pattern using the shape-corrected electron beam.

6. The electron beam lithography method according to claim 5, wherein the shape of the electron beam is corrected by adjusting a voltage applied to the deflector to change the shape of the electron beam.

* * * * *